United States Patent
Hung et al.

(10) Patent No.: US 7,586,184 B2
(45) Date of Patent: Sep. 8, 2009

(54) ELECTRONIC PACKAGE

(75) Inventors: Chih Pin Hung, Kaohsiung (TW); Chi Tsung Chiu, Kaohsiung (TW); In De Ou, Kaohsiung (TW); Yung Hui Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 148 days.

(21) Appl. No.: 11/870,620

(22) Filed: Oct. 11, 2007

(65) Prior Publication Data

US 2008/0145589 A1    Jun. 19, 2008

(30) Foreign Application Priority Data

Dec. 19, 2006   (TW) .............................. 95147735 A

(51) Int. Cl.
*H01L 23/498*   (2006.01)

(52) U.S. Cl. ............................... 257/686; 257/E23.069

(58) Field of Classification Search ................. 257/686, 257/777, 678, E23.069

See application file for complete search history.

(56) References Cited

U.S. PATENT DOCUMENTS

2003/0111720 A1*   6/2003   Tan et al. .................... 257/686
2009/0057863 A1*   3/2009   Chow et al. ................. 257/686

\* cited by examiner

*Primary Examiner*—Nathan W Ha

(57) ABSTRACT

An electronic package is provided. The electronic package includes a first substrate, an electronic component, a first sealant, a second substrate, a plurality of bonding wires and a second sealant, wherein the first substrate has opposing upper and lower surfaces and a plurality of bonding pads is disposed on the upper surface of the first substrate. The electronic component is positioned on the upper surface of the first substrate and electrically connected to the bonding pads. The first sealant is formed on the upper surface of the first substrate to encapsulate the electronic component. The lower surface of the second substrate is attached to the first sealant. The upper surface of the second substrate includes a central protrusion and a rim portion which surrounds and is lower than the central protrusion. A plurality of bonding wires is used to electrically connect the rim portion to the first substrate. The second sealant is formed on the upper surface of the first substrate and on the rim portion of the second substrate to encapsulate the bonding wires, the first sealant and the rim portion.

19 Claims, 3 Drawing Sheets

ELECTRONIC PACKAGE

CROSS REFERENCE TO RELATED APPLICATION

This application claims the priority benefit of Taiwan Patent Application Serial Number 095147735 filed Dec. 19, 2006, the full disclosure of which is incorporated herein by reference.

BACKGROUND OF THE INVENTION

1. Field of the Invention

The invention relates to an electronic package, and more particularly, to an electronic package with a central protrusion on the substrate.

2. Description of the Related Art

As electronic products are getting smaller and lighter, the packages for protecting and interconnecting IC chips also have the same trend. With ever-increasing demands for miniaturization and higher operating speeds, multi-chip packages have become an attractive approach in a variety of electronic device. Multi-chip packages, which contain two or more chips in a single package, can help minimize the limitation in system operation speed. In addition, multi-chip packages are capable of decreasing the interconnection length between IC chips thereby reducing signal delays and access times.

Referring to FIG. 1, a conventional stacked package includes a first substrate 100, a second chip 110, a passive component 112, a first sealant 120, a second substrate 130, a plurality of bonding wires 140, a second sealant 150 and a first chip 160. A plurality of first bonding pads 102 is disposed on the upper surface 100a of the first substrate 100 and a plurality of metal bumps 104 is attached to the lower surface 100b of the first substrate 100. The second chip 110 and passive component 112 are disposed on the upper surface 100a of the first substrate 100 and are electrically connected to the first bonding pads 102 by bonding wires 114 and conductive blocks 116 respectively. The first sealant 120 is formed on the upper surface 100a of the first substrate 100 to encapsulate the second chip 110 and passive component 112. The lower surface 130b of the second substrate 130 is attached to the first sealant 120 and a plurality of second bonding pads 136 is disposed on the upper surface 130a of the second substrate 130. The bonding wires 140 electrically connect the second bonding pads 136 to the first bonding pads 102. The second sealant 150 is formed on the upper surface 100a of the first substrate 100 and on the upper surface 130a of the second substrate 130 to encapsulate the bonding wires 140, the first sealant 120 and the second bonding pads 136. The first chip 160 and passive component 112 are positioned on the upper surface 130a of the second substrate 130 and electrically connected to the second bonding pads 136 by conductive blocks 162.

In the above stacked package, it is necessary for the second sealant 150 to protrude from the second substrate 130 so as to totally encase the bonding wires 140 which are used to electrically connect the second substrate 130 to the first substrate 100. Therefore, the mold for forming the sealant 150 is very special so that the resulting sealant 150 can totally encase the bonding wires 140. Such special mold is much expensive and thus leads to the increase in production cost.

Accordingly, there exists a need to provide an electronic package to solve the above-mentioned problems.

SUMMARY OF THE INVENTION

It is an object of the present invention to provide an electronic package that can be manufactured with lower production cost.

In one preferred embodiment, the electronic package of the present invention at least includes a first substrate, an electronic component, a first sealant, a second substrate, a plurality of bonding wires and a second sealant, wherein the first substrate has opposing upper and lower surfaces and a plurality of bonding pads is disposed on the upper surface of the first substrate. The electronic component is positioned on the upper surface of the first substrate and electrically connected to the bonding pads. The first sealant is formed on the upper surface of the first substrate to encapsulate the electronic component. The lower surface of the second substrate is attached to the first sealant. The upper surface of the second substrate includes a central protrusion and a rim portion which surrounds and is lower than the central protrusion. A plurality of bonding wires is used to electrically connect the rim portion to the first substrate. The second sealant is formed on the upper surface of the first substrate and on the rim portion of the second substrate to encapsulate the bonding wires, the first sealant and the rim portion. The electronic component can be such as an active component or a passive component.

In another preferred embodiment, at least one trench is further formed on the central protrusion. The trench can prevent the molten sealant from flowing through the gap between the mold and the central protrusion to the upper surface of the central protrusion during the formation of the second sealant.

The electronic packages of the present invention are characterized in that the second substrate has a central protrusion, and the bonding wires and sealant are positioned on the rim portion of the second substrate. In this way, there is no need to use the special mold for forming the sealant to encase the bonding wires. The ordinary mold can be used to form the sealant. Accordingly, the production cost can be greatly reduced. Besides, in the electronic packages of the present invention, only a conventional flat substrate is required to be replaced with a substrate having a central protrusion. There is no need to change the manufacturing process in order to form the electronic packages of the present invention.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
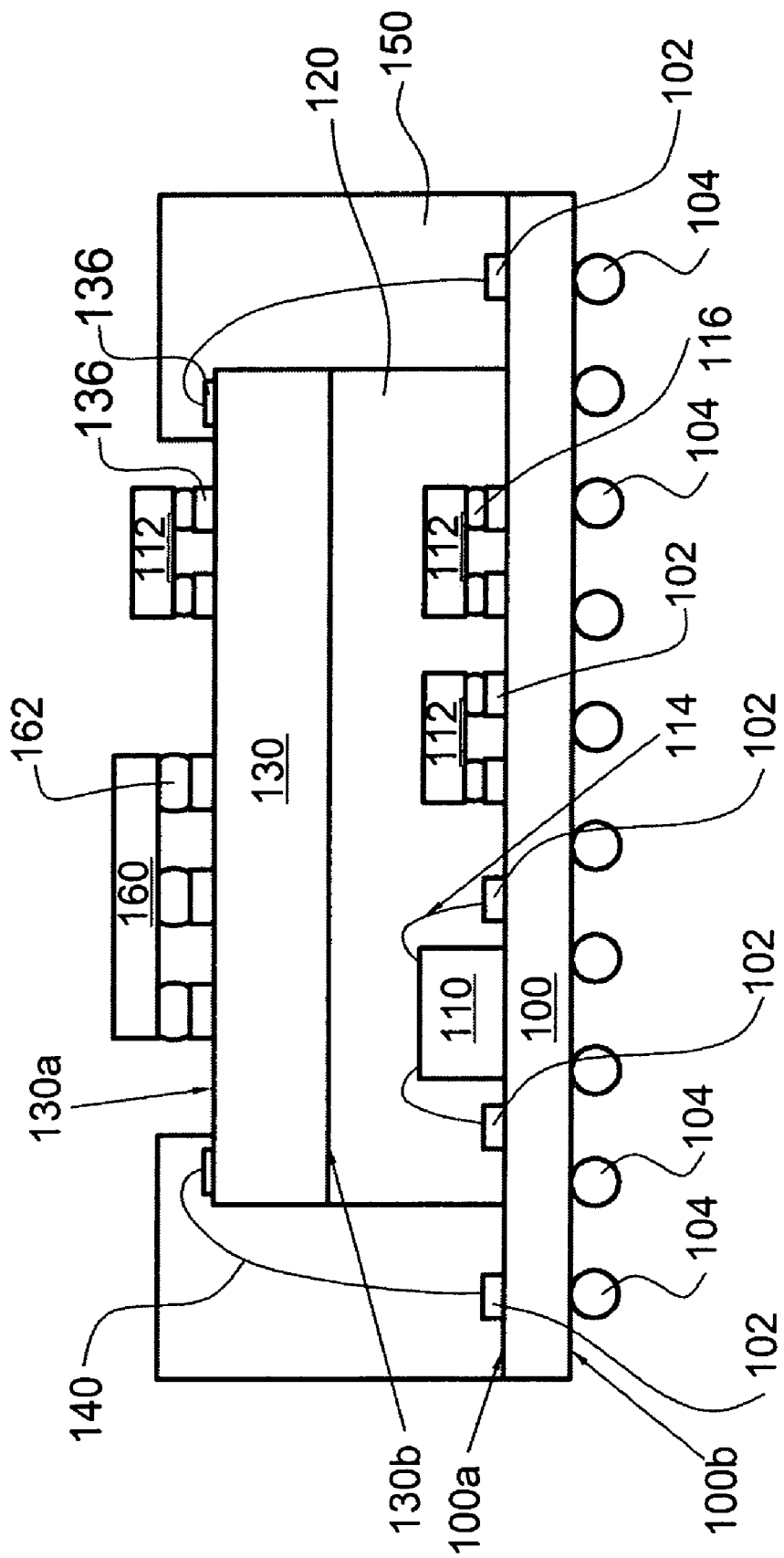
FIG. 1 is a cross-sectional view of a conventional stacked package.
Figure 2:
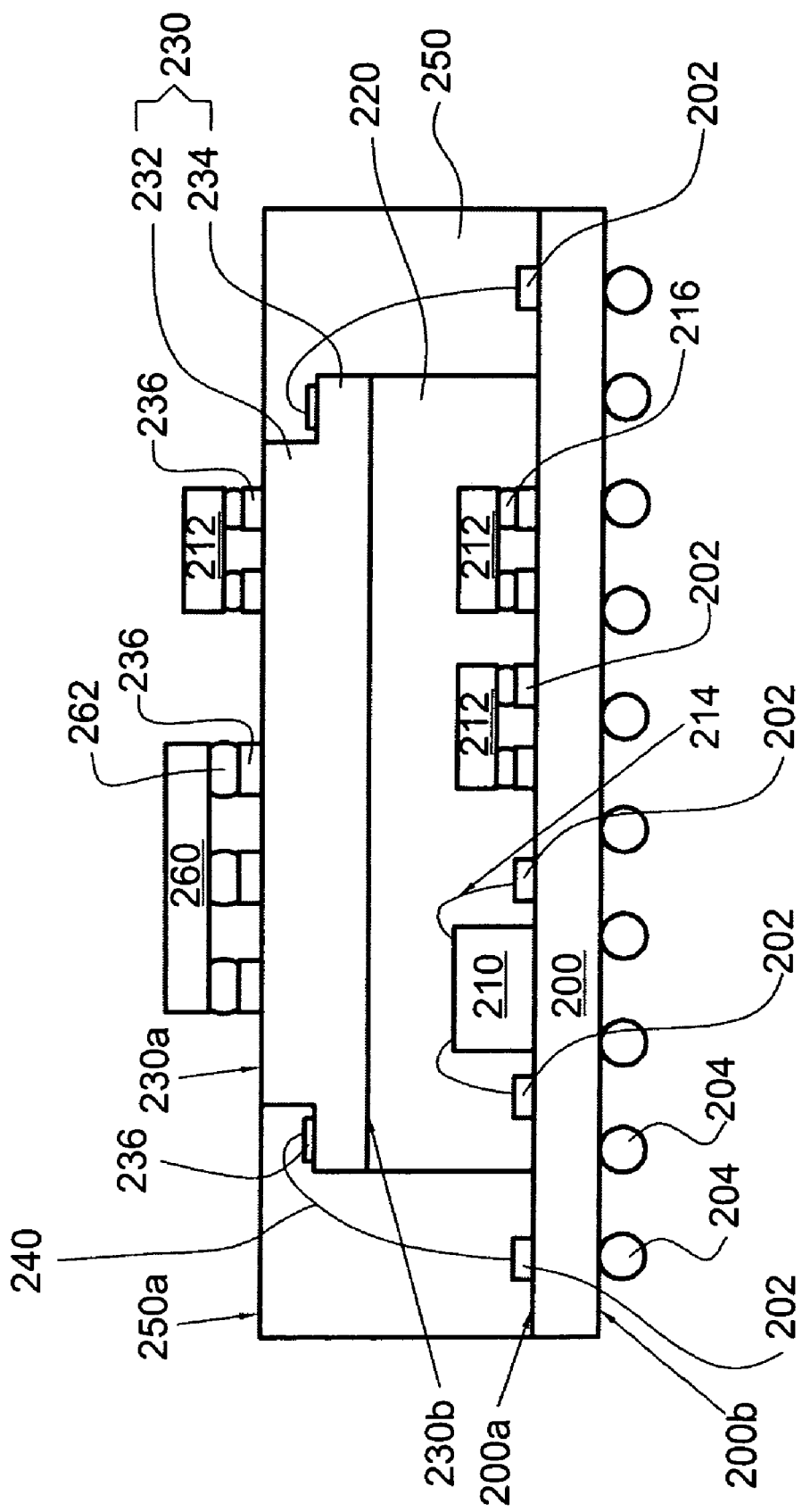
FIG. 2 is a cross-sectional view of an electronic package according to a preferred embodiment of the present invention.

Referring to FIG. 2, it is a cross-sectional view of an electronic package according to a preferred embodiment of the present invention. The electronic package according to the preferred embodiment of the present invention at least includes a first substrate 200, a first electronic component such as an active component 210 or a passive component 212, a first sealant 220, a second substrate 230, a plurality of bonding wires 240, a second sealant 250 and a second electronic component such as a memory chip 260 or a passive component 212, wherein the first substrate 200 has opposing upper surface 200a and lower surface 200b. A plurality of first bonding pads 202 is disposed on the upper surface 200a of the first substrate 200 and a plurality of metal bumps 204 is attached to the lower surface 200b of the first substrate 200. The first electronic component is positioned on the upper surface 200a of the first substrate 200 and electrically connected to the first bonding pads 202. In this embodiment, the active component 210 is an application-specific integrated circuit (ASIC) and the passive component 212 is a capacitor or a resistor. The active component 210 and the passive component 212 are electrically connected to the first bonding pads 202 by bonding wires 214 and conductive blocks 216 respectively. However, the way to electrically connect these elements to each other is not limited to the above method; other way can also be used to do so. The first sealant 220 is formed on the upper surface 200a of the first substrate 200 to encapsulate the active component 210 and passive component 212. In this embodiment, the first sealant 220 is made of polyimide or epoxy; however, other material can also be used to form the first sealant 220. In addition, the lower surface of the first sealant 220 is smaller than the upper surface 200a of the first substrate 200. The lower surface 230b of the second substrate 230 is attached to the first sealant 220 by a layer of adhesive (not shown in the figure). The upper surface 230a of the second substrate 230 includes a central protrusion 232 and a rim portion 234 which surrounds and is lower than the central protrusion 232. A plurality of second bonding pads 236 is disposed on the central protrusion 232 and the rim portion 234. In this embodiment, the lower surface 230b of the second substrate 230 is equal to the upper surface of the first sealant 220 in area and therefore the lower surface 230b of the second substrate 230 is smaller than the upper surface 200a of the first substrate 200. A plurality of bonding wires 240 is used to electrically connect the second bonding pads 236 on the rim portion 234 to the first bonding pads 202 on the first substrate 200. In this embodiment, the bonding wires 240 are made of gold; however, other material can also be used to form the bonding wires 240. It is to be noted that the bonding wires 240 are curved and the distance from the tops of the curved bonding wires 240 to the upper surface 200a of the first substrate 200 is smaller than that from the upper surface 230a of the central protrusion 232 to the upper surface 200a of the first substrate 200. The second sealant 250 is formed on the upper surface 200a of the first substrate 200 and on the rim portion 234 of the second substrate 230 to encapsulate the bonding wires 240, the first sealant 220 and the rim portion 234. In this embodiment, the upper surface 250a of the second sealant 250 is coplanar with the central protrusion 232 of the second substrate 230. In addition, the second sealant 250 is made of polyimide or epoxy; however, other material can also be used to form the second sealant 250. The second electronic component is positioned on and electrically connected to the central protrusion 232 of the second substrate 230. In this embodiment, the second electronic component includes a chip 260 and a passive component 212 which are electrically connected to the second bonding pads 236 on the central protrusion 232 by conductive blocks 262. However, the way to electrically connect these elements to each other is not limited to the above method; other way can also be used to do so.

Figure 3:
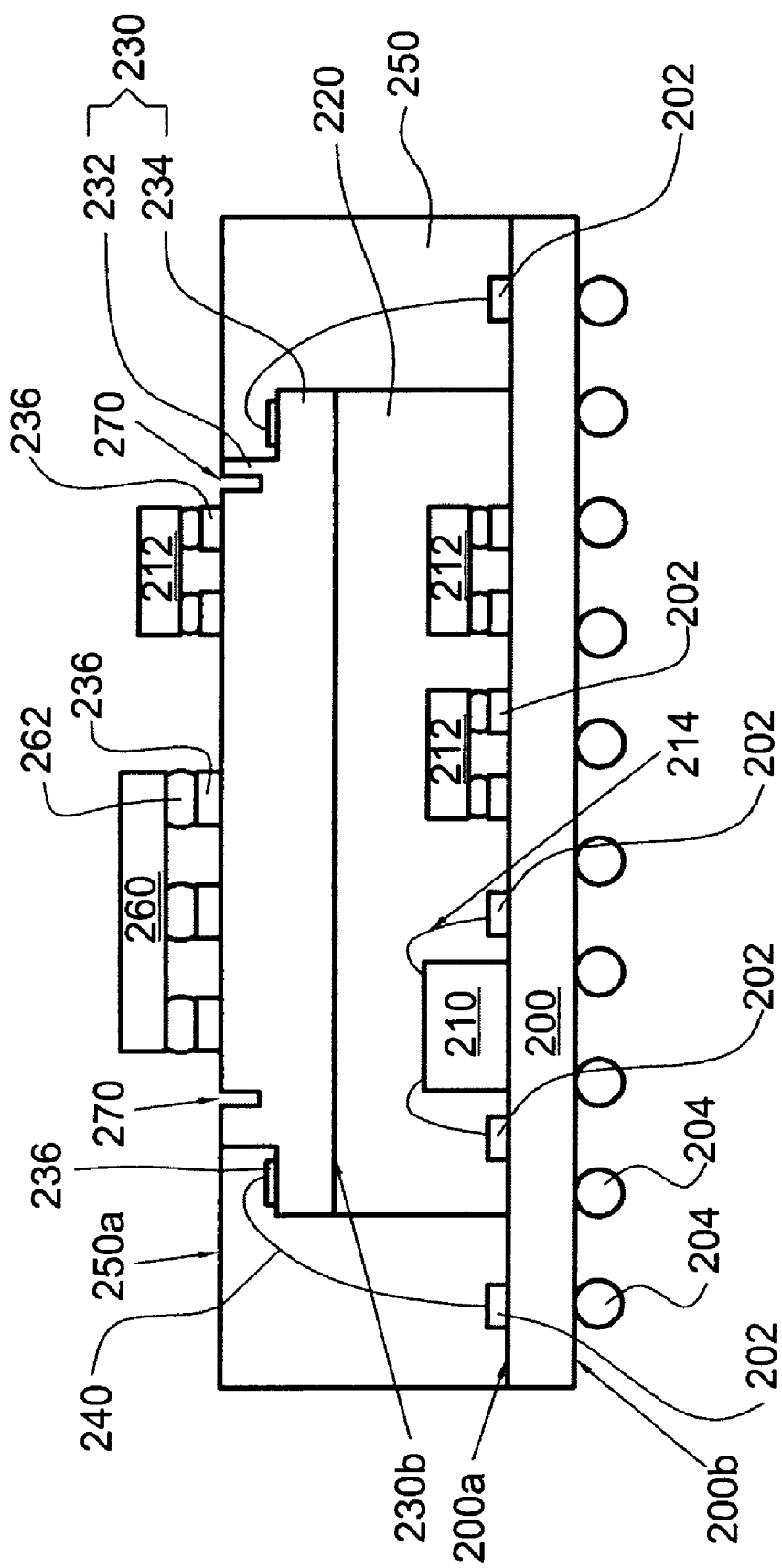
FIG. 3 is a cross-sectional view of an electronic package according to another preferred embodiment of the present invention.

Referring to FIG. 3, it is a cross-sectional view of an electronic package according to another preferred embodiment of the present invention. The electronic package according to this embodiment is similar to that illustrated in FIG. 2 and the difference between the two packages is in that at least one trench 270 is formed on the central protrusion 232 in this embodiment. The trench 270 can prevent the molten sealant from flowing through the gap between the mold and the central protrusion 232 (not shown in the figure) to the upper surface 230a of the central protrusion 232 to cover the second bonding pads 236 on the central protrusion 232 during the formation of the second sealant 250.

In summary, the electronic packages of the present invention are characterized in that the upper substrate has a central protrusion, and the bonding wires and sealant are positioned on the rim portion of the upper substrate. In this way, there is no need to use the special mold for forming the sealant to encapsulate the bonding wires as described above. The ordinary mold can be used to form the sealant. Accordingly, the production cost can be greatly reduced. Besides, in the electronic packages of the present invention, only a conventional flat substrate is required to be replaced with a substrate having a central protrusion. There is no need to change the manufacturing process in order to form the electronic packages of the present invention.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electronic package, comprising:
a first substrate having opposing upper and lower surfaces;
a plurality of bonding pads disposed on the upper surface of the first substrate;
at least one first electronic component disposed on the first substrate and electrically connected to the bonding pads;
a first sealant formed on the first substrate to encapsulate the first electronic component;
a second substrate disposed on the first sealant and having opposing first and second surfaces, the first surface of the second substrate having a central protrusion and a rim portion which surrounds and is lower than the central protrusion;
a plurality of bonding wires electrically connecting the rim portion of the second substrate to the first substrate; and
a second sealant formed on the first substrate and on the rim portion of the second substrate to encapsulate the bonding wires, the first sealant and the rim portion of the second substrate.

2. The electronic package as claimed in claim 1, further comprising:
a second electronic component disposed on and electrically connected to the central protrusion of the second substrate.

3. The electronic package as claimed in claim 2, wherein the second electronic component is a chip.

4. The electronic package as claimed in claim 2, wherein the second electronic component is a passive component.

5. The electronic package as claimed in claim 1, further comprising:
a plurality of metal bumps attached to the lower surface of the first substrate.

6. The electronic package as claimed in claim 1, wherein the first electronic component is an application-specific integrated circuit (ASIC).

7. The electronic package as claimed in claim 1, wherein the first electronic component is a passive component.

8. The electronic package as claimed in claim 1, wherein the first sealant is made of polyimide.

9. The electronic package as claimed in claim 1, wherein the first sealant is made of epoxy.

10. The electronic package as claimed in claim 1, wherein the lower surface of the first sealant is smaller than the upper surface of the first substrate.

11. The electronic package as claimed in claim 1, wherein the second surface of the second substrate is equal to the upper surface of the first sealant in area.

12. The electronic package as claimed in claim 1, wherein the second surface of the second substrate is smaller than the upper surface of the first substrate.

13. The electronic package as claimed in claim 1, wherein the bonding wires are made of gold.

14. The electronic package as claimed in claim 1, wherein the bonding wires are curved and the distance from the tops of the curved bonding wires to the upper surface of the first substrate is smaller than that from the upper surface of the central protrusion of the second substrate to the upper surface of the first substrate.

15. The electronic package as claimed in claim 1, wherein the second sealant is made of polyimide.

16. The electronic package as claimed in claim 1, wherein the second sealant is made of epoxy.

17. The electronic package as claimed in claim 1, wherein the upper surface of the second sealant is coplanar with the central protrusion of the second substrate.

18. The electronic package as claimed in claim 1, wherein at least one trench is formed on the central protrusion of the second substrate.

19. The electronic package as claimed in claim 1, further comprising:
   a layer of adhesive applied between the second substrate and the first sealant.

* * * * *